| (12) | United States Patent | (10) Patent No.: | US 11,088,007 B1 |
|---|---|---|---|
| | Fecioru | (45) Date of Patent: | Aug. 10, 2021 |

(54) COMPONENT TETHERS WITH SPACERS

(71) Applicant: X-Celeprint Limited, Dublin (IE)

(72) Inventor: Alin Mihai Fecioru, Cork (IE)

(73) Assignee: X-Celeprint Limited, Dublin (IE)

( * ) Notice: Subject to any disclaimer, the term of this patent is extended or adjusted under 35 U.S.C. 154(b) by 0 days.

(21) Appl. No.: 16/869,152

(22) Filed: May 7, 2020

(51) Int. Cl.
*H01L 21/683* (2006.01)

(52) U.S. Cl.
CPC ..... *H01L 21/6835* (2013.01); *H01L 2224/11001* (2013.01); *H01L 2224/83897* (2013.01); *H01L 2924/18301* (2013.01)

(58) Field of Classification Search
CPC .................. H01L 21/6835; H01L 2221/68381
USPC ........................................................ 257/798
See application file for complete search history.

(56) References Cited

U.S. PATENT DOCUMENTS

| 7,622,367 | B1 | 11/2009 | Nuzzo et al. |
|---|---|---|---|
| 7,943,491 | B2 | 5/2011 | Nuzzo et al. |
| 8,039,847 | B2 | 10/2011 | Nuzzo et al. |
| 8,722,458 | B2 | 5/2014 | Rogers et al. |
| 8,877,648 | B2 | 11/2014 | Bower et al. |
| 8,889,485 | B2 | 11/2014 | Bower |
| 9,142,468 | B2 | 9/2015 | Bower et al. |
| 9,217,541 | B2 | 12/2015 | Bathurst et al. |
| 9,358,775 | B2 | 6/2016 | Bower et al. |
| 9,368,683 | B1* | 6/2016 | Meitl ..................... H01L 33/26 |
| 9,548,233 | B2 | 1/2017 | Golda et al. |
| 9,601,356 | B2 | 3/2017 | Bower et al. |
| 9,640,715 | B2 | 5/2017 | Bower et al. |
| 9,741,592 | B2 | 8/2017 | Hu et al. |
| 9,761,754 | B2 | 9/2017 | Bower et al. |
| 9,929,053 | B2 | 3/2018 | Bower et al. |
| 10,832,934 | B2 | 11/2020 | Trindade et al. |
| 10,832,935 | B2 | 11/2020 | Bower et al. |
| 2016/0093600 | A1 | 3/2016 | Bower et al. |
| 2017/0141382 | A1* | 5/2017 | Dadheech ............. H01M 4/366 |
| 2019/0051552 | A1* | 2/2019 | Bower ................ H01L 33/0093 |

\* cited by examiner

*Primary Examiner* — Vu A Vu

(74) *Attorney, Agent, or Firm* — Choate, Hall & Stewart LLP; William R. Haulbrook; Michael D. Schmitt

(57) ABSTRACT

A component structure comprises a substrate and a sacrificial layer comprising a sacrificial material disposed on or in the substrate. The sacrificial layer defines sacrificial portions laterally spaced apart by anchors. A component is disposed entirely over each sacrificial portion and connected to at least one anchor by a tether. A spacer comprising a spacer material is disposed in or on the sacrificial portion at least partially between the tether and the substrate. For at least one etchant, the spacer material etches faster than the sacrificial material when exposed to the etchant.

23 Claims, 8 Drawing Sheets

COMPONENT TETHERS WITH SPACERS

TECHNICAL FIELD

The present disclosure generally relates to source wafers having tether structures designed for micro-transfer printing components.

BACKGROUND

Substrates with electronically active components distributed over the extent of the substrate may be used in a variety of electronic systems, for example, in flat-panel display components such as flat-panel liquid crystal or organic light emitting diode (OLED) displays, in imaging sensors, and in flat-panel solar cells. The electronically active components are typically either assembled on the substrate, for example using individually packaged surface-mount integrated-circuit components and pick-and-place tools, or by coating a layer of semiconductor material on the substrate and then photolithographically processing the semiconductor material to form thin-film circuits on the substrate. Individually packaged integrated-circuit components typically have smaller transistors with higher performance than thin-film circuits but the packages are larger than can be desired for highly integrated systems.

Methods for transferring small, active components from one substrate to another are described in U.S. Pat. Nos. 7,943,491, 8,039,847, and 7,622,367. In these approaches, small integrated circuits are formed on a native semiconductor source wafer. The small, unpackaged integrated circuits, or chiplets, are released from the native source wafer by pattern-wise etching portions of a sacrificial layer located beneath the chiplets, leaving each chiplet suspended over an etched sacrificial layer portion by a tether physically connecting the chiplet to an anchor separating the etched sacrificial layer portions. A viscoelastic stamp is pressed against the process side of the chiplets on the native source wafer, adhering each chiplet to an individual stamp post. The stamp with the adhered chiplets is removed from the native source wafer. The chiplets on the stamp posts are then pressed against a non-native target substrate or backplane with the stamp and adhered to the target substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

Stamps comprising many individual posts can transfer many thousands of chiplets in a single transfer operation. It is important, therefore, to carefully control the etching and printing process, for example by carefully controlling the component, anchor, and tether structures, to micro-transfer print systems at a high yield with reduced costs. Thus, there is a need for structures, methods, and materials for constructing, releasing, and printing chiplets from a source wafer to a non-native target substrate.

SUMMARY

The present disclosure provides, inter alia, methods and structures for releasing a micro-transfer-printable component from a source wafer faster and more efficiently. According to some embodiments of the present disclosure, a component structure comprises a substrate and a patterned sacrificial layer comprising a sacrificial material disposed on or in the substrate. The patterned sacrificial layer defines sacrificial portions laterally spaced apart by anchors. A component is disposed entirely over each sacrificial portion and connected to at least one anchor by a tether. A spacer comprising a spacer material is disposed in or on the sacrificial portion at least partially between the tether and the substrate. The spacer can be in direct physical contact with the sacrificial portion. The spacer material etches faster than the sacrificial material when exposed to a common etchant, for example an etchant that etches both the spacer material and the sacrificial material in a common step or at the same time.

According to some embodiments of the present disclosure, the spacer is in direct contact with the tether. The spacer can be in direct contact with the anchor, the spacer can be in direct contact with the component, or the spacer can be in direct contact with both the anchor and the component. The spacer can also be in direct contact with the substrate below the sacrificial layer, e.g., at the bottom of the sacrificial layer or sacrificial portion. The spacer material can be $Al_2O_3$.

According to some embodiments, the sacrificial material can be a single-crystal material, for example silicon or a compound semiconductor, and can be anisotropically etchable by the etchant. Each sacrificial portion can be at least partially exposed.

According to some embodiments, (i) the substrate comprises a semiconductor material, (ii) the patterned sacrificial layer comprises a semiconductor material, (iii) the sacrificial portion comprises a semiconductor material, or (iv) any one or combination of (i), (ii), and (iii). The semiconductor material can be silicon or a compound semiconductor and can be the same material as the sacrificial material, or different. The semiconductor material can be crystalline silicon having a crystal structure of {100} or {111}.

According to some embodiments, the etchant material is tri-methyl ammonium hydroxide (TMAH) or potassium hydroxide (KOH).

According to some embodiments of the present disclosure, (i) the component is encapsulated with an encapsulating material, (ii) the anchor is encapsulated with or comprises an encapsulating layer, or (iii) both (i) and (ii). The tether can comprise the encapsulating material or the encapsulating material can form the tether. The encapsulating material can be at least partially in direct contact with the sacrificial portion.

According to some embodiments of the present disclosure, a method of making a component structure comprises the step of providing a substrate. The substrate can comprise a patterned sacrificial layer or a patterned sacrificial layer can be disposed on the substrate. The patterned sacrificial layer can comprise a sacrificial material disposed on or in the substrate. The patterned sacrificial layer can comprise sacrificial portions laterally spaced apart by anchors. Components are disposed entirely over each sacrificial portion and connected to at least one anchor by a tether. A spacer comprising a spacer material is disposed in or on the sacrificial portion at least partially between the tether and the substrate. The spacer material etches faster than the sacrificial material when exposed to an etchant. In some embodiments, the sacrificial portion and the spacer are etched in a common step at a common time with a common etchant, removing the sacrificial portion thereby forming a gap and suspending the component over the sacrificial portion by the tether.

Some embodiments comprise disposing the spacer in, on, or at a perimeter of the sacrificial portion. Some embodiments comprise disposing an encapsulating layer at least over or on the spacer. Some embodiments comprise etching a trench around the component, the trench extending to the sacrificial portion, or comprise etching a trench around, in, or at a perimeter of the sacrificial portion. Some embodiments comprise disposing the spacer before providing the component. Some embodiments comprise disposing the component before disposing the spacer.

Structures and methods described herein enable an efficient and fast release of a micro-transfer printable component from a source wafer on or in which the component is disposed or formed.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1A:
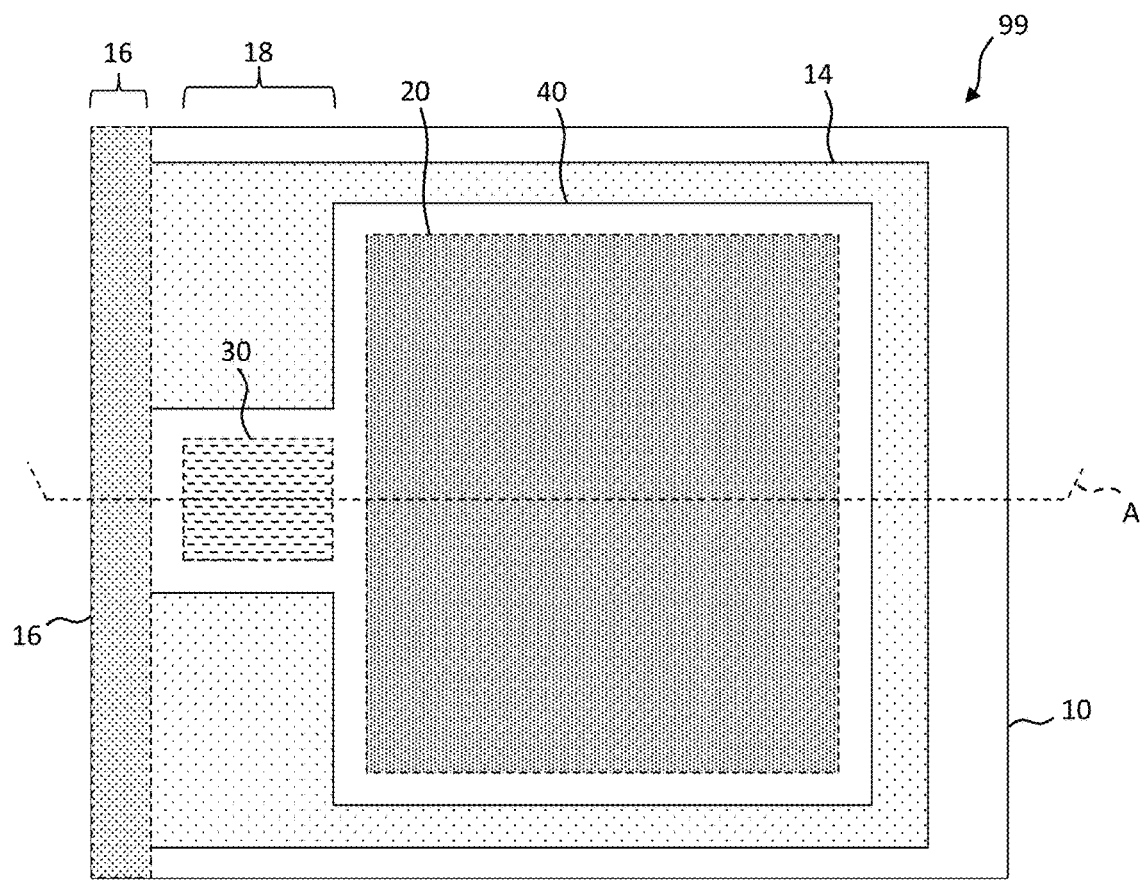
FIG. 1A is a plan view of a component structure on a sacrificial layer of a source wafer according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present disclosure provides, inter alia, a structure and method for improving the release of a micro-transfer-printable component structure from a source wafer by etching, in particular for a sacrificial layer in the source wafer that comprises an anisotropically etchable crystalline semiconductor material such as silicon {111} or silicon {100}.

Figure 1B:
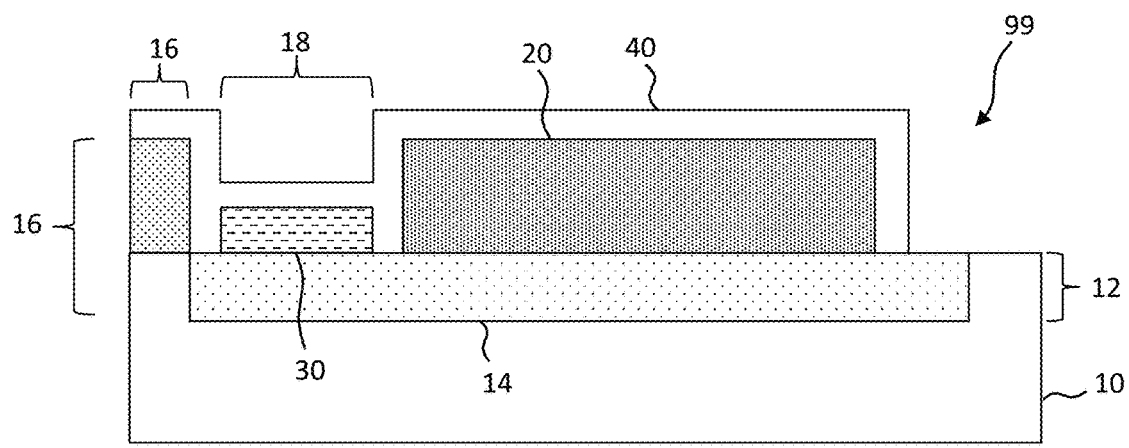
FIG. 1B is a cross-section corresponding to cross section line A of FIG. 1A according to illustrative embodiments of the present disclosure.
Figure 1C:
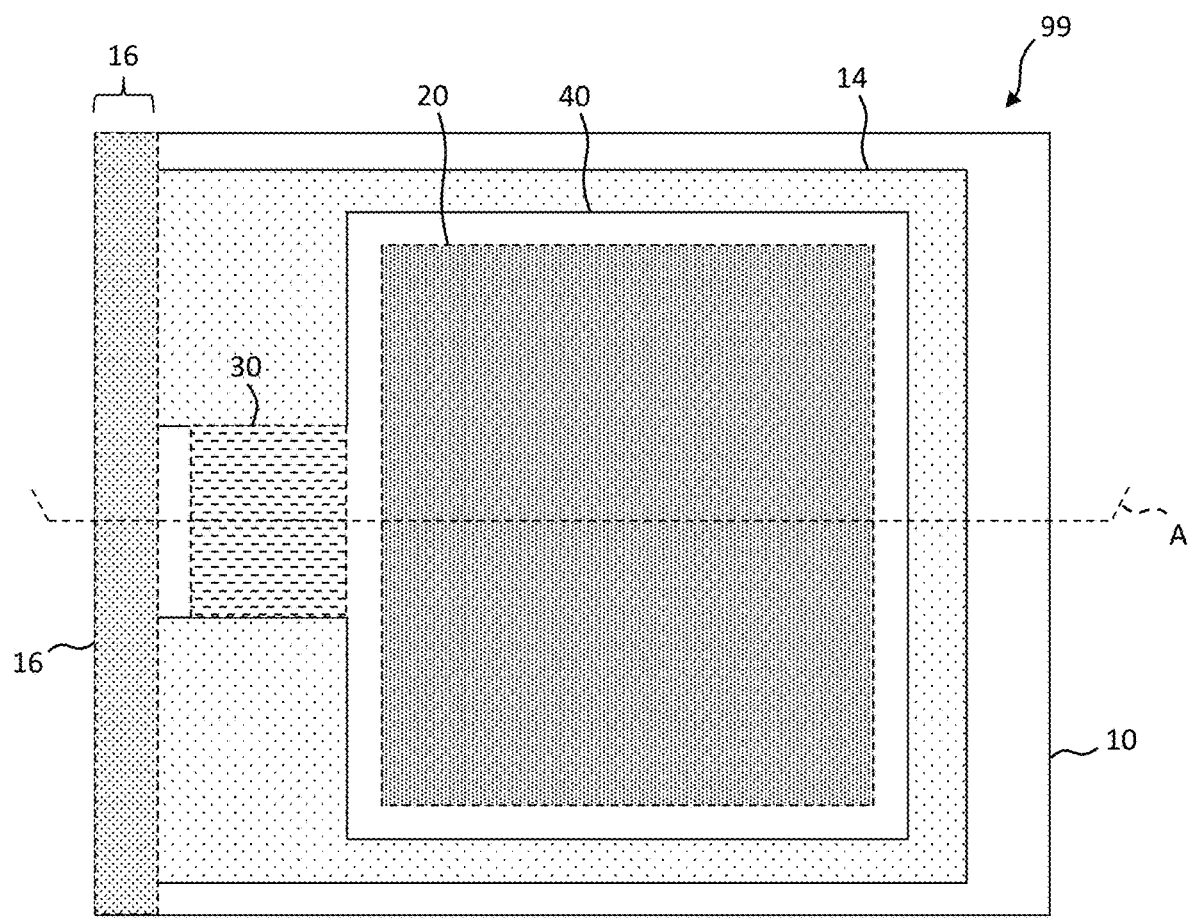
FIG. 1C is a plan view of a component structure on a sacrificial layer of a source wafer according to illustrative embodiments of the present disclosure.

According to some embodiments of the present disclosure, and as illustrated in FIGS. 1A, 1B, and 1C illustrate a component structure 99 comprising a substrate 10 and a patterned sacrificial layer 12 disposed on or in the substrate 10. The patterned sacrificial layer 12 defines sacrificial portions 14 comprising a sacrificial material laterally spaced apart by anchors 16. Anchors 16 can be a portion of sacrificial layer 12, can be disposed over sacrificial layer 12, or both (e.g., anchors 16 can include a portion of sacrificial material). As illustrated, anchors 16 comprise a portion of sacrificial layer 12 and material deposited on sacrificial layer 12, for example the same material deposited to form components 20 in a common step or an encapsulating material. A component 20 is disposed entirely over each sacrificial portion 14 and connected to an anchor 16 by a tether 18. An encapsulation layer 40 comprising an encapsulation material can encapsulate any one or combination of component 20, tether 18, and anchor 16. In some embodiments, encapsulation layer 40 forms tether 18 or a portion of tether 18 so that tether 18 comprising encapsulation layer 40 or the encapsulation material. In some embodiments, encapsulation layer 40 forms anchor 16 or a portion of anchor 16. A spacer 30 comprising a spacer material is disposed in or on sacrificial portion 14 at least partially between tether 18 and substrate 10 and can be disposed in or on a perimeter of sacrificial portion 14. The spacer material etches faster than the sacrificial material when exposed to an etchant in a common step. In some embodiments, multiple etchants exist that could with a particular combination of sacrificial material(s) and spacer material(s) etch the spacer material(s) faster than the sacrificial material(s). Spacer 30 serves to prevent arrest of the etch process, for example an anisotropic etch process, thereby reducing the release time and helping to avoid over-etching of other portions of component structure 99, for example component 20.

Figure 5A:
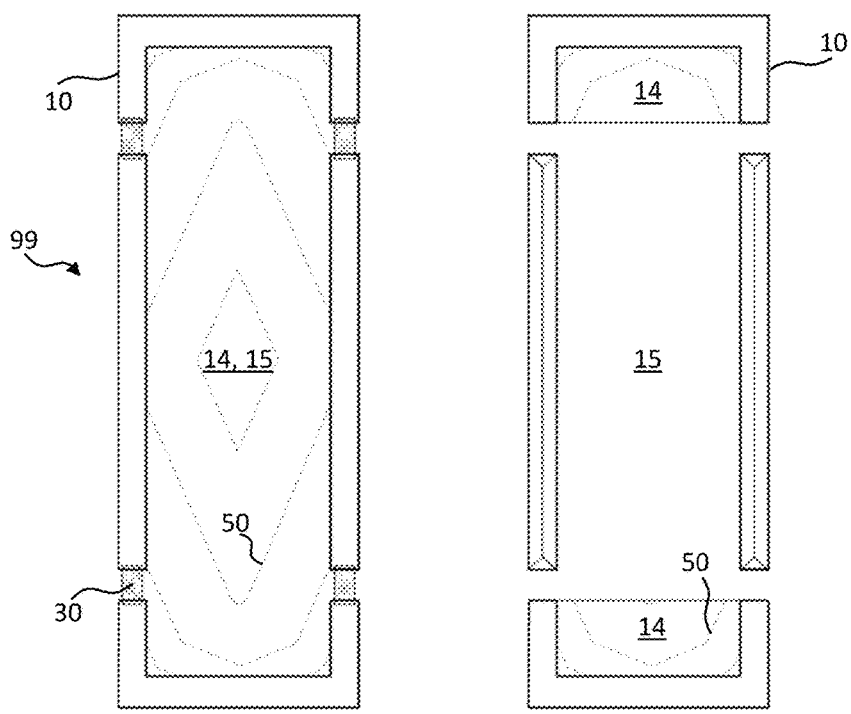
FIG. 5A is a partial top view of a component structure in a source wafer excluding the component according to illustrative embodiments of the present disclosure (left) and a partial top view of a gap in a source wafer useful in understanding illustrative embodiments of the present disclosure (right)

Substrate 10 can comprise a sacrificial layer 12 that can be native to substrate 10 (e.g., a portion of anisotropically etchable material) or formed on or in substrate 10 (e.g., by one or more steps of photolithographic patterning, for example of different materials from substrate 10). Sacrificial layer 12 can be patterned. Sacrificial layer 12 can define sacrificial portions 14 spaced apart (e.g., laterally) by anchors 16. Anchors 16 can include sacrificial material or material differently etchable from sacrificial material, or both. Sacrificial material can be different from material in components 20. Sacrificial portions 14 can be defined by designated portions of sacrificial layer 12, for example designated by how they are exposed to etchants (e.g., due to being partially covered by component 20) during etching. For example, in a silicon substrate 10, sacrificial portions 14 can be portions of silicon substrate 10 under (e.g., and extending slightly beyond, e.g., as shown in FIG. 1B) components 20 while anchors 16 can be or include portions of substrate 10 laterally adjacent to components 20. Anchors 16 can be disposed in sacrificial layer 12. An example of sacrificial layer 12 defining sacrificial portions 14 that are designated portions of sacrificial layer 12 native to substrate 10 is shown in FIG. 5A. A structure as shown in FIGS. 1A-1B can also be constructed, in some embodiments, where substrate 10 is a silicon substrate (e.g., including {111} or {100} oriented silicon) and sacrificial portions 14 are defined as designated portions of sacrificial layer 12 of substrate 10, with anchors 16 including portions of sacrificial layer 12. In some embodiments, a sacrificial layer 12 is patterned and sacrificial portions 14 are defined by areas of different material (e.g., an oxide) from other portions of sacrificial layer 12 (e.g., that are differently etchable from the oxide).

Figure 2:
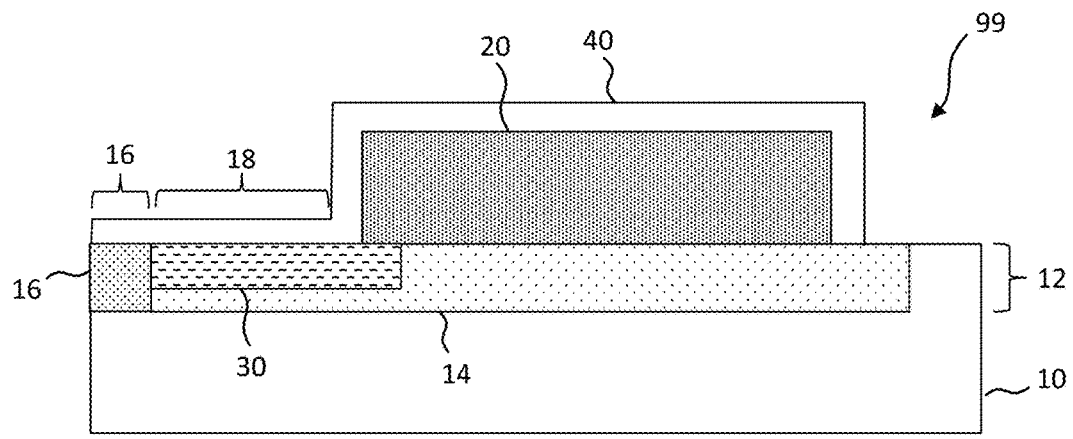
FIG. 2 is a cross section of a component on a sacrificial layer of a source wafer according to illustrative embodiments of the present disclosure.
Figure 3:
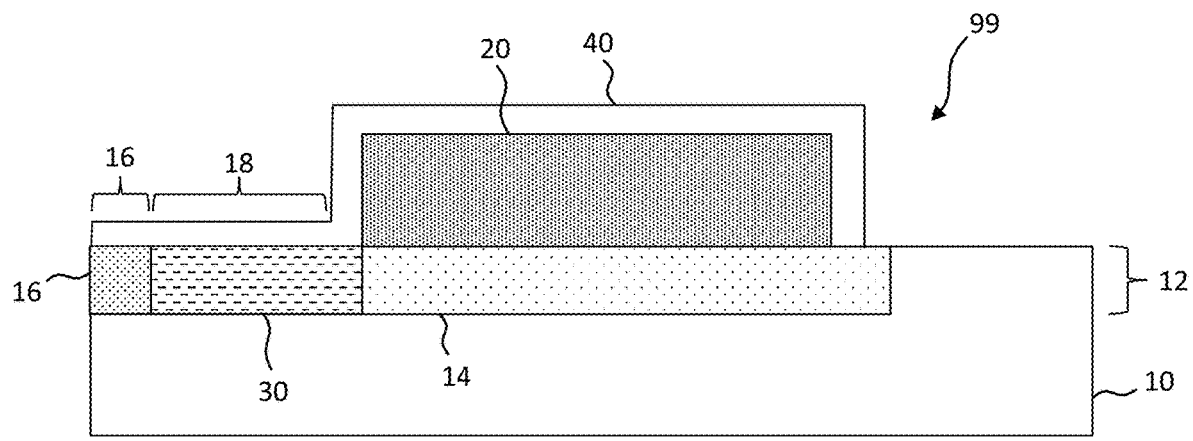
FIG. 3 is a cross section of a component on a sacrificial layer of a source wafer according to illustrative embodiments of the present disclosure.

In some embodiments of the present disclosure, spacer 30 is in direct contact with tether 18. In some embodiments of the present disclosure, spacer 30 is above and in direct physical contact with sacrificial layer 12 with respect to substrate 10 and can be separated from anchor 16 or component 20, or both, by tether 18 or encapsulation layer 40. Tether 18 can contact the top (side opposite substrate 10) and sides of spacer 30, so that tether 18 can at least partially contact sacrificial material of sacrificial portion 14. Similarly, encapsulation material of encapsulation layer 40 can contact the top (side opposite substrate 10) and sides of spacer 30, so that encapsulation material can at least partially contact sacrificial material of sacrificial portion 14. In some embodiments, spacer 30 extends into sacrificial portion 14 toward substrate 10 (e.g., as shown in FIG. 2) and can contact anchor 16 or component 20, or both. In some embodiments, spacer 30 extends into sacrificial portion 14 toward substrate 10 and is in direct contact with substrate 10 (e.g., as shown in FIG. 3) and anchor 16. As shown in FIG. 1A, spacer 30 is surrounded by encapsulation layer 40 above sacrificial portion 14. In FIG. 1C, spacer 30 extends to an edge of encapsulation layer 40 in a direction parallel to the nearest edges of anchor 16 and component 20. By extending tether 30 to an edge of encapsulation layer 40, an etchant can more quickly and readily begin etching spacer 30 without delay from etching beneath encapsulation layer 40.

According to some embodiments of the present disclosure, the sacrificial material in sacrificial portions 14 is a single-crystal material and can be anisotropically etchable by the etchant. Thus, according to some embodiments of the present disclosure, substrate 10 comprises a semiconductor material, (ii) patterned sacrificial layer 12 comprises a semiconductor material, (iii) sacrificial portion 14 comprises a semiconductor material, or (iv) any one or combination of (i), (ii), and (iii). The semiconductor material can be silicon or a compound semiconductor. The semiconductor material or sacrificial material can be crystalline silicon having a crystal structure of {100} or {111}. Each sacrificial portion 14 can be at least partially exposed, for example to an etchant in a wet etch process or to ambient conditions such that an etchant can readily begin etching when contacted to the sacrificial portion 14. Substrate 10 can be a source wafer 10, for example a native source wafer for components 20 so that components 20 comprise a similar or same material as the source wafer 10, for example single-crystalline silicon. In general, a semiconductor material of component 20 is a different material and is differentially etchable from material of sacrificial portion 14, so that sacrificial portion 14 can be etched without etching component 20. For example, component 20 can comprise GaN and sacrificial portion 14 can comprise silicon or component 20 can comprise silicon and sacrificial portion 14 can comprise an oxide material, for example a patterned buried oxide layer.

According to some embodiments of the present disclosure, the spacer material is an oxide (e.g., $Al_2O_3$), is easily patternable, etches at a much faster rate than the substrate material, and is able to withstand high processing temperatures for extended periods of time. For example, encapsulation layer 40 can be formed over and after spacer 30, so that spacer 30 must be able to withstand encapsulation layer 40 deposition temperatures. Encapsulation layer 40 can comprise oxides such as silicon dioxide and nitrides such as silicon nitride typically deposited at temperatures over 200 degrees C. and often approximately 300 degrees C. for higher quality films. Therefore, according to some embodiments of the present disclosure, spacer 30 must be able to withstand a temperature of approximately 200 C or must be able to withstand a temperature of 300 C.

According to some embodiments of the present disclosure, the etchant is tri-methyl ammonium hydroxide (TMAH), for example evaporated $Al_2O_3$ processed at a low temperature, for example less than 200 degrees C. and subsequently patterned by a lift-off process. In some embodiments, the etch process takes place at a lower temperature than a temperature of the encapsulation layer 40 deposition or the spacer 30 deposition.

Figure 4:
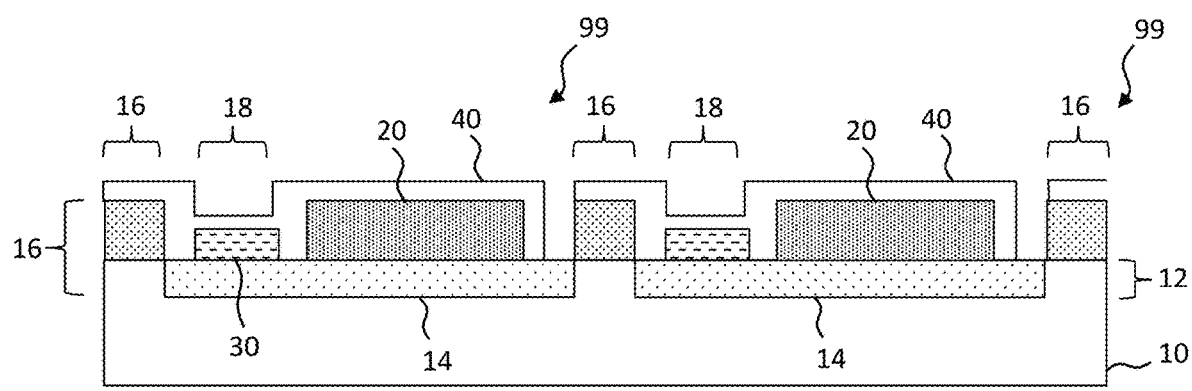
FIG. 4 is a cross section of multiple components on corresponding sacrificial portions of a source wafer according to illustrative embodiments of the present disclosure.

As illustrated in FIG. 4, multiple component structures 99 can be disposed or formed on substrate 10. Each component 20 is disposed entirely over a separate and independent sacrificial portion 14 and is laterally separated from other components 20 by anchors 16.

Figure 5B:
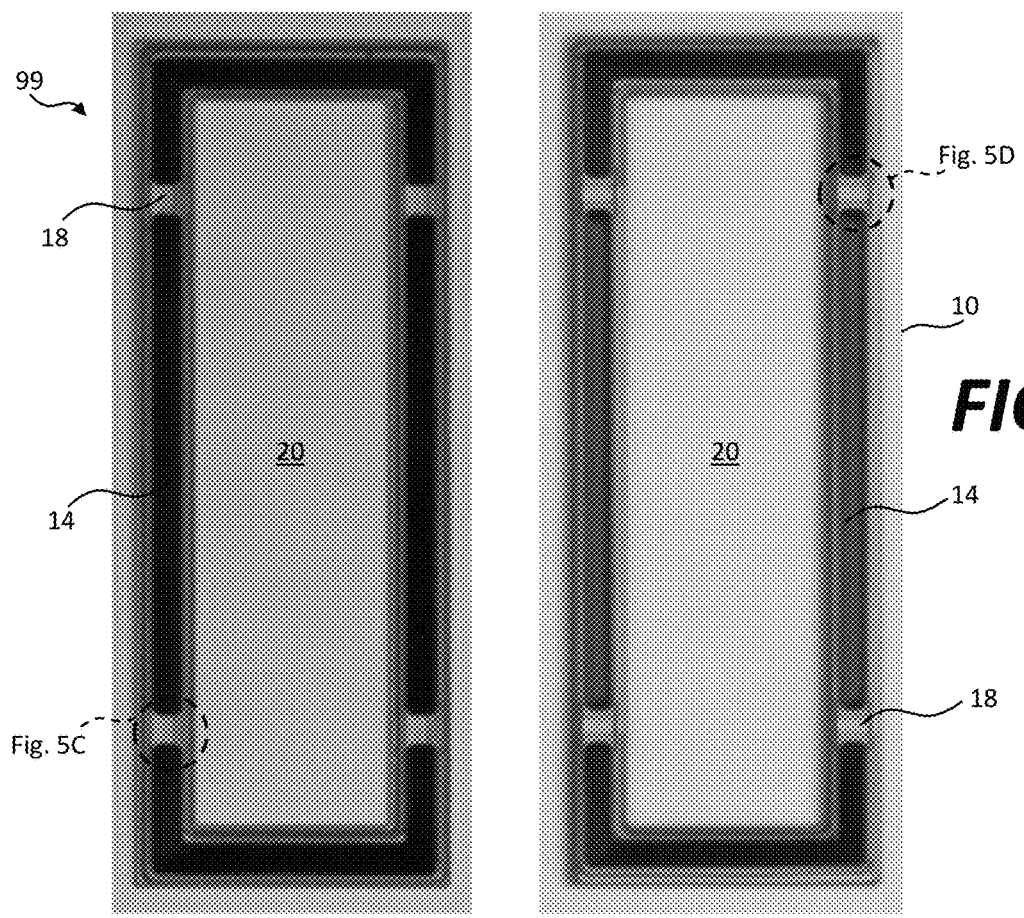
FIG. 5B is a micrograph of a component suspended over a gap in a source wafer according to illustrative embodiments of the present disclosure (left, corresponding to the left partial top view of FIG. 5A) and a micrograph of a component suspended over a gap in a source wafer useful in understanding illustrative embodiments of the present disclosure (right, corresponding to the right partial top view of FIG. 5A)
Figure 5C:
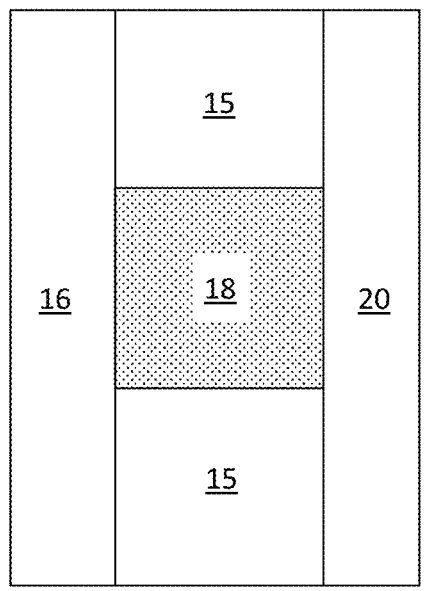
FIG. 5C is an enlarged plan view of the tether shown in the left-side illustrations of FIGS. 5A and 5B.
Figure 5D:
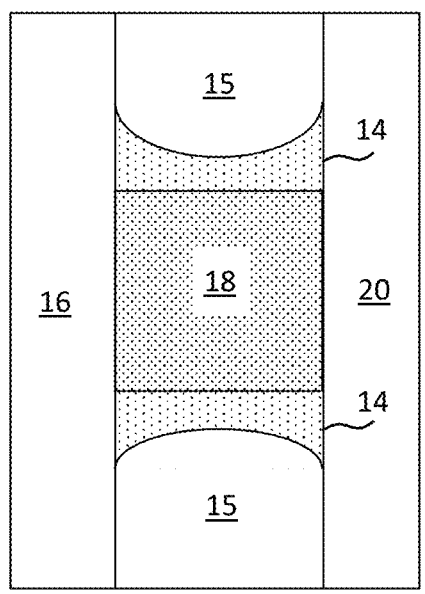
FIG. 5D is an enlarged plan view of the tether shown in the right-side illustrations of FIGS. 5A and 5B.
Figure 6:
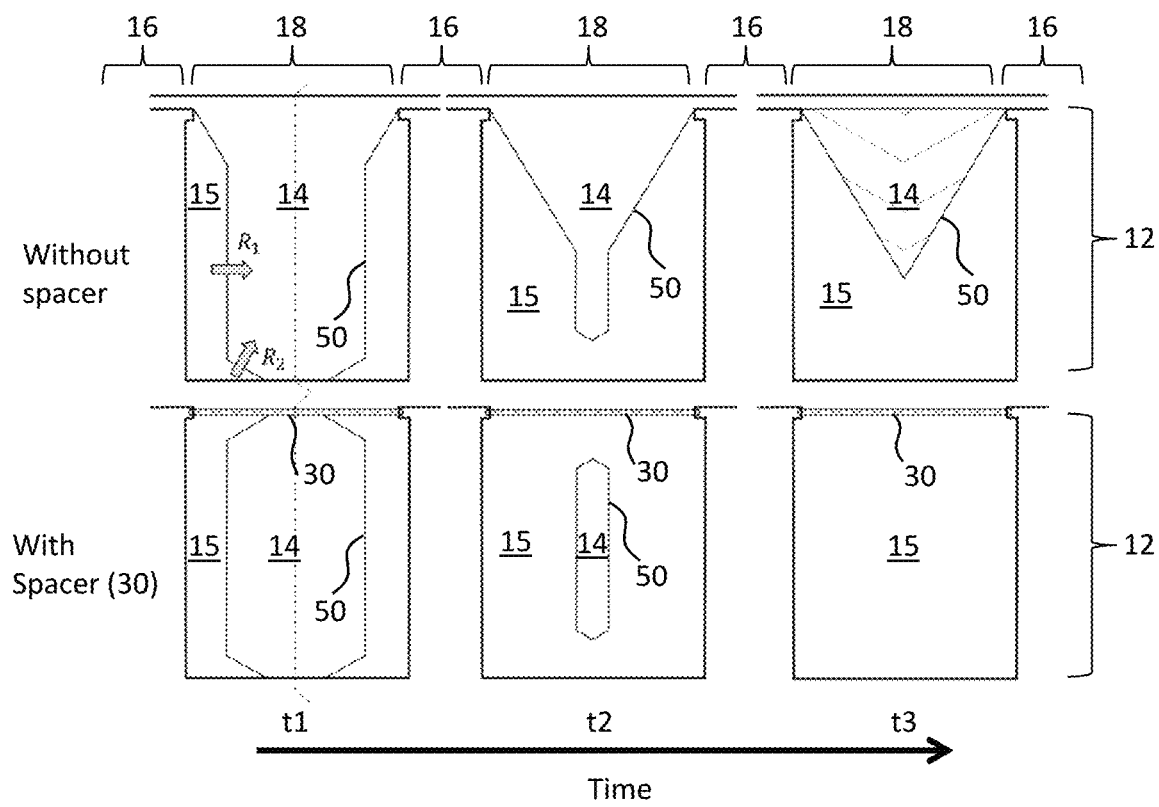
FIG. 6 shows a series of sequential cross sections over time of an etched sacrificial portion and gap useful in understanding embodiments of the present disclosure (top) and a series of sequential cross sections over time of an etched spacer, sacrificial portion, and gap according to illustrative embodiments of the present disclosure (bottom)
Figure 7:
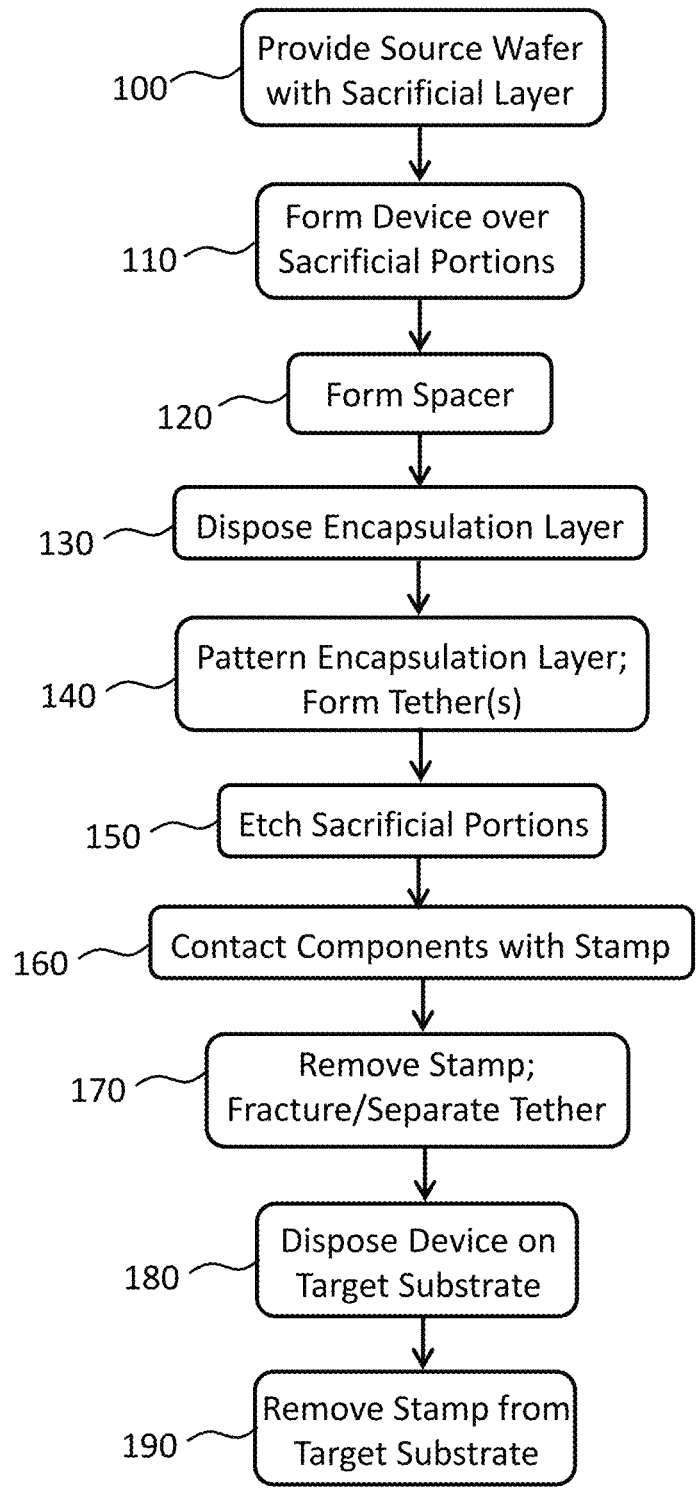
FIG. 7 is a flow diagram of a method according to illustrative embodiments of the present disclosure.

As illustrated in FIGS. 5C-6 and the flow diagram of FIG. 7, some methods of making a component structure 99 according to embodiments of the present disclosure comprise providing a substrate 10 having a patterned sacrificial layer 12 comprising a sacrificial material disposed on or in substrate 10 in step 100. Patterned sacrificial layer 12 comprises sacrificial portions 14 laterally spaced apart by anchors 16. A component 20 is disposed entirely and directly over each sacrificial portion 14 and connected to at least one anchor 16 by a tether 18 in step 110. In step 120, a spacer 30 comprising a spacer material is disposed in or on sacrificial portion 14 at least partially between tether 18 and substrate 10. Spacer 30 can be disposed in or on a perimeter of sacrificial portion 14. The spacer material etches faster than the sacrificial material when exposed to an etchant. Optionally, an encapsulation layer 40 is disposed over substrate 10 and structures on substrate 10, in particular over spacer 30, and can contact sacrificial portion 14 in step 130 and then patterned in step 140. Patterned encapsulation layer 40 can form, encapsulate, or comprise tether 18 or anchor 16, or both, and can encapsulate component 20.

In step 150, sacrificial portions 14 and spacer 30 are etched with an etchant in a common step with a common etchant. Step 150 can define tether 18 (or further define tether 18) and remove sacrificial portions 14 and spacers 30 forming a gap 15 between component 20 and substrate 10, thereby suspending components 20 over gap 15 by tether 18. Etching step 150 can comprise first etching a trench around component 20 or around or in a perimeter of sacrificial portion 14, where the trench extends to sacrificial portion 14. Etching step 150 can comprise etching a trench, thereby exposing sacrificial portion 14, for example to enable etching sacrificial portion 14 and spacer 30 with an etchant. In some embodiments, spacer 30 is disposed or formed before component 20 or component 20 is disposed or formed before spacer 30.

As shown in the illustrations of FIG. 5A and micrographs of FIG. 5B, etch fronts 50 formed during etching step 150 are pinned where concave corners of sacrificial portions 14 expose slow etching planes (using the example of a rectangular shaped component 20 on {111} Si in this case) and etching is greatly slowed. Since tethers 18 are aligned vertically along such slow etching planes, the etching fronts stop and the undercut of component 20 cannot progress any further, as shown in the successive etch fronts 50 shown in the right-side graphic of FIG. 5A. In contrast, where fast-etching spacers 30 are present, when the etching of the slow etching planes stops, the spacers 30 are exposed to the etchant and can quickly etch, exposing fast-etching planes in sacrificial portions 14 so that the component 20 undercut proceeds rapidly, as shown with the sequential etch fronts 50 in the left-side graphic of FIG. 5A, thereby rapidly releasing component 20 from substrate 10, increasing the process rate and avoiding over-etching of other elements of component structure 99. As shown in the left-side graphic of FIG. 5A, successive etch fronts 50 converge on the center of sacrificial portion 14 forming gap 15. In contrast, the right-side graphic shows that etch fronts 50 are delayed by the openings (where tethers 18 are disposed, but not shown in the right-side graphic of FIG. 5A).

FIG. 5B shows the equivalent structure formed by the etching process with spacer 30 for component structure 99 (left-side micrograph) and an equivalent structure without spacer 30 (right-side micrograph). A tether 18 for the left-side micrograph is shown in FIG. 5C and a tether 18 for the right-side micrograph is shown in FIG. 5D. As shown in FIG. 5C, where spacer 30 was present, gap 15 formed by etching sacrificial portion 14 contacts tether 18 between anchor 16 and component 20 and undercuts component 20. However, as shown in FIG. 5D, where no spacer 30 was present, gap 15 formed by etching sacrificial portion 14 does not completely contact tether 18 between anchor 16 and component 20 and does not completely undercut component 20 or is at least delayed in undercutting component 20.

As shown in the top-row illustration of FIG. 6, in the absence of spacer 30 the full component 20 width is undercut first leaving a triangular shaped Si pillar which has to be etched along the long (slow) side until component 20 is released. Thus, the undercutting process is delayed on the tethering side. By undercutting tether 18 much faster than the underlying silicon where spacer 30 is present (as shown in the bottom-row illustration of FIG. 6, the slow etching constraint is removed. The release time in the two cases can be approximated as follows:

$$\text{Release } time_{without\ spacer} = \frac{w}{2R_1} + \frac{w}{2R_2 \tan 30}$$

$$\text{Release } time_{with\ spacer} = \frac{w}{2R_1}$$

where w represents the component 20 width. When the etch rates are equal ($R_1=R_2=R$) the components 20 without spacer 30 release 2.7 times slower than those with spacer 30.

FIG. 6 provides a cross section illustrating the etch process. The top row of FIG. 6 shows sacrificial portion 14 without spacer 30 etched at three successive times t1, t2, t3 and the bottom row shows sacrificial portion 14 with spacer 30 etched at the three successive times t1, t2, t3. As shown in the top row of illustrations, etch fronts 50 shown by arrows R1 and R2 progress from the edges of sacrificial portion 14 forming gap 15 but, when etch front 50 forms a triangle where the slow-etch planes are present, etching slows significantly, leaving the triangular shaped Si pillar to be slowly etched along the long side along the length of component 20, as shown in the right-side illustration of the top row of FIG. 6.

As shown in the bottom row of illustrations, etch fronts 50 shown by arrows R1 and R2 progress from the edges of sacrificial portion 14 and very quickly along fast-etching spacer 30 forming gap 15. Because etched spacer 30 exposes fast-etching sacrificial material planes, no slow-etch planes are exposed or present, so the etching process can progress rapidly until gap 15 is fully formed, as shown in the right-side illustration of the bottom row of FIG. 6. Thus, embodiments of the present disclosure provide a more efficient and faster process and structure for releasing components 20 from substrate 10 for micro-transfer printing.

As is further shown in FIG. 7, components 20 can be micro-transfer printed to a target (destination) substrate using a provided stamp. The stamp contacts components 20 in step 160, adhering components 20 to the stamp. The stamp is removed with component 20 from substrate 10 in step 170, thereby fracturing or separating tether(s) 18 and, in step 180, the stamp contacts components 20 to a target substrate to adhere components 20 to the target substrate. The stamp is then removed in step 190, leaving components 20 adhered to the target substrate.

Components 20 can be micro-components suitable for micro-transfer printing. A micro-component is any component 20 that has at least one dimension that is in the micron range, for example having a planar extent in a range from 2 microns by 5 microns to 200 microns by 500 microns (e.g., an extent of 2 microns by 5 microns, 20 microns by 50 microns, or 200 microns by 500 microns) and a thickness of from 200 nm to 200 microns (e.g., at least or no more than 2 microns, 20 microns, or 200 microns). Components 20 can have different sizes, for example, less than 1,000 square microns, less than 10,000 square microns, less than 100,000 square microns, or less than 1 square mm, or larger. Components 20 can have, for example, at least one of a length, a width, and a thickness of no more than 500 microns (e.g., no more than 250 microns, no more than 100 microns, no more than 50 microns, no more than 25 microns, or no more than 10 microns).

In some embodiments of the present disclosure, components 20 are small integrated circuits having a thin substrate with at least one of (i) a thickness of only a few microns, for example less than or equal to 25 microns, less than or equal to 15 microns, or less than or equal to 10 microns, (ii) a width of 5-1000 microns (e.g., 5-10 microns, 10-50 microns, 50-100 microns, or 100-1000 microns) and (iii) a length of 5-1000 microns (e.g., 5-10 microns, 10-50 microns, 50-100 microns, or 100-1000 microns).

Component 20 can have any suitable aspect ratio or size in any dimension and any useful shape, for example a rectangular cross section or rectangular top surface or rectangular bottom surface. Components 20 can have various aspect ratios, for example at least 1:1, at least 2:1, at least 5:1, or at least 10:1. Component 20 can be, for example, an integrated circuit, optoelectronic device, or micro-electro-mechanical (MEMs) device such as an electromechanical filter that filters electrical signals through mechanically resonant vibrations, for example an acoustic resonator or a power source that responds to mechanical vibrations with electrical power.

Components 20 can be made in a native source semiconductor wafer (e.g., a silicon wafer) having a process side and a back side used to handle and transport the wafer using photolithographic processes. The components 20 can be formed using photolithographic processes in an active layer on or in the process side of the source wafer 10 (substrate 10). Methods of forming such structures are described, for example, in U.S. Pat. No. 8,889,485. According to some embodiments of the present disclosure, source wafers 10 can be provided with components 20, sacrificial layer 12 (an etchable release layer), and tethers 18 already formed, or they can be constructed as part of the process in accordance with certain embodiments of the present disclosure. In certain embodiments, components 20 can be constructed using foundry fabrication processes used in the art. Layers of materials can be used, including materials such as metals, oxides, nitrides and other materials used in the integrated-circuit art.

Tethers 18 can comprise any suitable tether material, for example an encapsulation material such as an oxide (silicon oxide), nitride (silicon nitride), or semiconductor (silicon) and can incorporate one or more layers, for example one or more layers similar to or the same as those layer(s) of component 20, for example comprising electrode materials, substrate materials, or dielectric materials. Materials, such as dielectrics, for example silicon dioxide or silicon nitride, can be used in tethers 18. Substrate 10 can be any useful substrate in which sacrificial portion 14 and gap 15 can be formed, for example as found in the integrated circuit or display industries. Substrate 10 can be chosen, for example, based on desirable growth characteristics (e.g., lattice constant, crystal structure, or crystallographic orientation) for growing one or more materials thereon. In some embodiments of the present disclosure, substrate 10 is an anisotropically etchable. For example, substrate 10 can be a monocrystalline silicon substrate with a {100} or {111} orientation. An anisotropically etchable material etches at different rates in different crystallographic directions, due to reactivities of different crystallographic planes to a given etchant. For example, potassium hydroxide (KOH) displays an etch rate selectivity 400 times higher in silicon <100> crystal directions than in silicon <111> directions.

Substrate 10 can be a source wafer 10 and each component 20 can be disposed completely and directly over a sacrificial portion 14 in a direction orthogonal to a surface of source wafer 10. In certain embodiments, source wafer 10 (substrate 10) can be any structure with a surface suitable for forming patterned sacrificial layers 12, sacrificial portions 14 (etched to form gap 15), anchors 16, and patterned components 20. For example, source wafers 10 can comprise any anisotropically etchable material. A surface of source wafer 10 surface can be substantially planar and suitable for photolithographic processing, for example as found in the integrated circuit or MEMs art.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST

A cross section line
10 substrate/source wafer
12 sacrificial layer
14 sacrificial portion/sacrificial material
15 gap
16 anchor
18 tether
20 component
30 spacer
40 encapsulation layer
50 etch front
99 component structure
100 provide source wafer with sacrificial layer step
110 form component over sacrificial portions step
120 form spacer step
130 form encapsulation layer step
140 pattern encapsulation layer step
150 etch sacrificial portions step
160 contact component with stamp step
170 remove stamp step
180 dispose component on target substrate step
190 remove stamp from target substrate step

The invention claimed is:

1. A component structure, comprising:
    a substrate comprising a sacrificial layer comprising a sacrificial material disposed on or in the substrate, the sacrificial layer defining sacrificial portions of the sacrificial material laterally spaced apart by anchors;
    a component disposed entirely over each of the sacrificial portions and connected to an anchor of the anchors by a tether; and
    a spacer comprising a spacer material disposed in or on the sacrificial portion at least partially between the tether and the substrate, such that at least one of (i) at least a portion of the spacer is between the sacrificial portion and the tether and (ii) the spacer extends into the sacrificial portion,
    wherein the spacer material is a different material from the sacrificial material and etches faster than the sacrificial material when exposed to an etchant.

2. The component structure of claim 1, wherein the spacer is in direct contact with the tether.

3. The component structure of claim 1, wherein the sacrificial material is a single-crystal material.

4. The component structure of claim 1, wherein the sacrificial material is anisotropically etchable by the etchant.

5. The component structure of claim 1, wherein (i) the substrate comprises a semiconductor material, (ii) the patterned sacrificial layer comprises a semiconductor material, (iii) the sacrificial portion comprises a semiconductor material, or (iv) any one or combination of (i), (ii), and (iii).

6. The component structure of claim 5, wherein the semiconductor material is silicon or a compound semiconductor.

7. The component structure of claim 6, wherein the semiconductor material is crystalline silicon having a {100} or {111} oriented crystal structure.

8. The component structure of claim 1, wherein the spacer material is an oxide.

9. The component structure of claim 8, wherein the spacer material is $Al_2O_3$.

10. The component structure of claim 1, wherein the etchant material is tri-methyl ammonium hydroxide (TMAH) or potassium hydroxide (KOH).

11. The component structure of claim 1, wherein (i) the spacer is in direct contact with the anchor, (ii) the spacer is in direct contact with the component, or (iii) both (i) and (ii).

12. The component structure of claim 1, wherein each of the sacrificial portions is at least partially exposed.

13. The component structure of claim 1, wherein (i) the component is encapsulated with an encapsulating material, (ii) the anchor is encapsulated with or comprises an encapsulating layer, or (iii) both (i) and (ii), and
wherein the tether comprises the encapsulating material.

14. The component structure of claim 13, wherein the encapsulating material is at least partially in direct contact with the sacrificial portion.

15. The component structure of claim 1, wherein the spacer material etches faster than the sacrificial material when exposed to a second etchant different from the etchant.

16. A method of making a component structure, comprising the steps of:
providing, for each of a plurality of sacrificial portions disposed on or in a substrate, a component disposed on a respective sacrificial portion of the plurality of sacrificial portions, wherein the component is connected to at least one anchor disposed on or in the substrate by a tether; and
providing a spacer comprising a spacer material disposed in or on the respective sacrificial portion at least partially between the tether and the substrate, such that at least one of (i) at least a portion of the spacer is between the sacrificial portion and the tether and (ii) the spacer extends into the sacrificial portion,
wherein the spacer material etches faster than a sacrificial material in the respective sacrificial portion when exposed to an etchant and the spacer material is a different material from the sacrificial material.

17. The method of claim 16, comprising etching the sacrificial portion and the spacer in a common step with a common etchant, thereby suspending the component over the sacrificial portion by the tether.

18. The method of claim 16, comprising disposing the spacer in or on a perimeter of the respective sacrificial portion.

19. The method of claim 18, comprising disposing an encapsulating layer at least over or on the spacer.

20. The method of claim 18, comprising etching a trench around the component, the trench extending to the respective sacrificial portion, or comprising etching a trench around or in a perimeter of the respective sacrificial portion.

21. The method of claim 16, comprising disposing the spacer before providing the component.

22. The method of claim 16, comprising providing the component before disposing the spacer.

23. A method of making a component structure, comprising the steps of:
providing, for each of a plurality of sacrificial portions disposed on or in a substrate, a component disposed on a respective sacrificial portion of the plurality of sacrificial portions, wherein the component is connected to at least one anchor disposed on or in the substrate by a tether; and
providing a spacer comprising a spacer material disposed in or on the respective sacrificial portion at least partially between the tether and the substrate,
etching the sacrificial portion and the spacer in a common step with a common etchant, thereby suspending the component over the sacrificial portion by the tether,
wherein the spacer material etches faster than a sacrificial material in the respective sacrificial portion when exposed to an etchant.

* * * * *